United States Patent [19]
Heide

[11] Patent Number: 5,701,104
[45] Date of Patent: Dec. 23, 1997

[54] RADIO-FREQUENCY OSCILLATOR OF PLANAR DESIGN

[75] Inventor: Patric Heide, München, Germany

[73] Assignee: Siemens Aktiengesellschaft, Munich, Germany

[21] Appl. No.: 716,436

[22] PCT Filed: Mar. 8, 1995

[86] PCT No.: PCT/DE95/00325

§ 371 Date: Sep. 23, 1996

§ 102(e) Date: Sep. 23, 1996

[87] PCT Pub. No.: WO95/26073

PCT Pub. Date: Sep. 28, 1995

[30] Foreign Application Priority Data

Mar. 23, 1994 [DE] Germany ............... 44 10 025.6

[51] Int. Cl.⁶ ................................................. H03B 5/18
[52] U.S. Cl. ........................ 331/96; 331/99; 331/117 D; 331/107 DP; 331/107 SL
[58] Field of Search ............... 331/96, 99, 117 D, 331/107 DP, 107 SL; 333/219.1

[56] References Cited

U.S. PATENT DOCUMENTS

| | | |
|---|---|---|
| 4,079,341 | 3/1978 | Linn et al. ........................ 331/96 |
| 4,731,611 | 3/1988 | Mueller et al. ................... 342/28 |
| 4,871,983 | 10/1989 | Graycar ........................... 331/96 |
| 4,982,167 | 1/1991 | Mori ............................... 331/96 |
| 5,164,691 | 11/1992 | Wakino et al. ................. 333/219.1 |

FOREIGN PATENT DOCUMENTS

| | | |
|---|---|---|
| 0 399 770 | 11/1990 | European Pat. Off. . |
| 28 08 507 C2 | 7/1978 | Germany . |
| 0 548 673 | 3/1974 | Switzerland . |
| 2 236 433 | 3/1991 | United Kingdom . |
| 2 239 988 | 7/1991 | United Kingdom . |

OTHER PUBLICATIONS

"Oscillators", I. Bahl et al, *Microwave Solid State Circuit Design*, Chapter 9, John Wiley & Sons, (1988), pp. 426–482.

*Primary Examiner*—David Mis
*Attorney, Agent, or Firm*—Hill, Steadman & Simpson

[57] ABSTRACT

In order to improve the phase noise and the temperature stability of a dielectric resonator oscillator, the cylindrical dielectric resonator which is important for the oscillation frequency is mounted on the substrate standing on its curved surface rather than lying on its end face, as conventionally customary. It is coupled to the RF lines in a higher mode ($TM_{xxx}$ mode) rather than in the fundamental mode ($TE_{01\delta}$ mode).

22 Claims, 4 Drawing Sheets

RADIO-FREQUENCY OSCILLATOR OF PLANAR DESIGN

BACKGROUND OF THE INVENTION

The invention relates to a radio-frequency oscillator of planar design which is stabilized by a dielectric resonator. An oscillator of this type, also referred to as a dielectric resonator oscillator (DRO), is used in a radar sensor for the microwave/millimeter wave range. The oscillator has an active element, a so-called RF amplifier, which is deliberately destabilized by a feedback network and is thus excited to form oscillations. The feedback network used is a narrow-band transmission or reflection filter which has the maximum possible quality and is stabilized using a dielectric resonator. A transmission filter is a filter which allows the signal to pass to the output at the resonant frequency. A reflection filter is a filter in which the signal fed in is reflected only at the resonant frequency.

A dielectric resonator oscillator is described in Bahl, L., Bhartia, P.: "Microwave Solid State Circuit Design", Chapter 9, John Wiley & Sons, 1988. A number of basic DRO circuits are also specified there. The oscillation frequency of the oscillator is defined by means of the dielectric resonator. The latter acts as a narrow-band frequency filter of quality Q.

The known oscillators have the disadvantage that the dielectric resonator is operated at its fundamental resonant frequency ($TE_{01\delta}$ mode). The usual coupling of the resonator to the circuit results in a low quality of the feedback filter, in particular in the case of oscillators for very high frequencies ($\geq 15 \ldots 20$ GHz). The temperature stability and the load dependence of the DRO deteriorates accordingly.

The maximum amplitude of the filter curve decreases approximately exponentially as the distance between the dielectric resonator and the RF line increases, but at the same time the quality Q of the filter increases. Since the highest possible Q is required to realize temperature-stable DROs with little phase noise, the dielectric resonator could be coupled as weakly as possible. In order to maintain the oscillation of the oscillator, this relatively weak coupling of the dielectric resonator and the active element must be compensated for by increasing the gain of the active element. However, this has narrow limits imposed on it as a result of the maximum gain which can be supplied by the active element.

SUMMARY OF THE INVENTION

The object of the invention is to specify an oscillator having distinctly improved properties in respect of the oscillator noise and the temperature stability.

In general terms the present invention is a radio-frequency oscillator of planar design having an amplifier, planar lines, a substrate, a dielectric resonator as a frequency-determining element. The amplifier is connected to the dielectric resonator by at least one of the planar lines arranged on the substrate. The dielectric resonator is designed in the form of a cylinder. The dielectric resonator is arranged standing on its curved surface directly or indirectly on or in the substrate. The normal vector of the end face of the dielectric resonator encloses an angle between 0° and 45° with the planar line. The dielectric resonator is operated in a higher mode than the fundamental mode.

In general terms the present invention is also a radio-frequency oscillator of planar design having an amplifier, a substrate, and a dielectric resonator as a frequency-determining element. The amplifier is connected to the dielectric resonator. The dielectric resonator is designed in the form of a cylinder. The dielectric resonator is operated in a higher mode than the fundamental mode. The dielectric resonator is arranged standing on its curved surface directly or indirectly on or in the substrate.

A high temperature stability, as well as extensive load independence of the oscillator and a reduction in the dielectric and resistive losses are advantageously produced. The eddy current losses can also be effectively reduced.

The orientation, of the end face of the dielectric resonator with reference to the planar conductor tracks has the advantage of strong coupling in conjunction with a high quality.

Advantageous developments of the present invention are as follows.

The cross-sectional shape of the cylinder of the dielectric resonator is circular. This provides ease of production.

The cross-sectional shape of the cylinder of the dielectric resonator is flattened. This provides ease of assembly.

The dielectric resonator is operated at modes at which a rotationally symmetrical field pattern prevails. If the dielectric resonator is operated at modes at which a rotationally symmetrical field pattern prevails, flattening the curved surface of the dielectric resonator has only an insignificant effect on the oscillation frequency and on the quality.

The relative dielectric constant of the dielectric resonator lies in a range from 30 to 45. This results in improved coupling. Dielectric materials having a relative dielectric constant in the range from 30 to 45 can be cost-effectively produced.

The dielectric resonator has a hole in its end face. This has the advantage that the resonant frequency of the dielectric resonator can be finely tuned by means of a dielectric or metallic body which can be pushed through the centric hole. The hole can furthermore be used as an assembly aid.

The diameter of the dielectric resonator is greater than the conductor track width. The diameter of the dielectric resonator can advantageously be provided to be greater than the distance between the planar conductor tracks, because it is thus possible to effect better coupling.

The planar lines are coplanar. Designing the planar conductor tracks to be coplanar has the advantage that the through-plating which is necessary depending on the oscillator circuit can be avoided.

The planar lines are microstrip lines. Designing the planar conductor tracks as microstrip lines has the advantage that sophisticated simulation programs for calculating the circuit are available for this, which simplifies the development.

The amplifier is a transistor. Alternatively, the amplifier is an IMPATT diode or a Gunn element. Depending on the application, it is more advantageous to provide the amplifier as a transistor, an IMPATT diode or a Gunn element.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

A DRO comprises a closed loop in which an active element, an amplifier (for example a bipolar transistor, a field-effect transistor, a Gum=diode or an IMPATT diode) and a dielectric resonator are arranged. Depending on the use of the active element as a reflection amplifier RV or as a transmission amplifier TV, the oscillators are referred to as reflection-type DROs, compare FIG. 1, or as transmission-type DROs, compare FIG. 2. Correspondingly, the resonator DR acts as a reflection or as a transmission filter.

Figure 1:
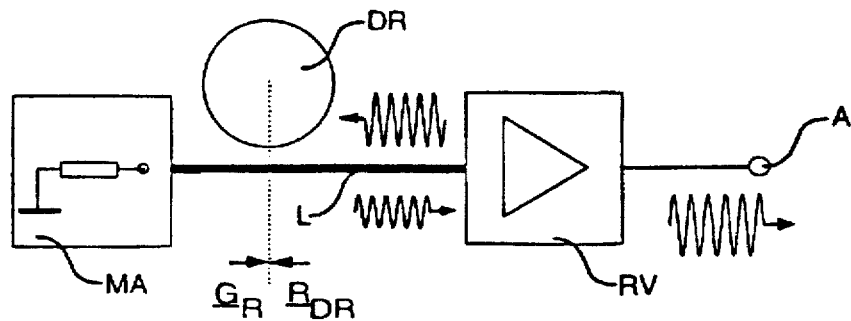
FIG. 1 shows the principle of a reflection-type dielectric resonator oscillator.

The reflection amplifier RV in FIG. 1 has a complex reflection gain $V_R$ where $|V_R|>1$. The feedback is made possible by a dielectric resonator DR. Oscillations occur when the condition $V_R \cdot R_{DR} \geq 1$ is met. $R_{DR}$ is the complex reflection factor of the dielectric resonator DR. The reflection amplifier RV is connected to a microwave absorber MA via a planar radio-frequency line L, generally in the form of a microstrip line, but also conceivable in the form of a coplanar line. Arranged between the microwave absorber MA and the reflection amplifier RV is the dielectric resonator DR, which couples via its leakage field with the field of the radio-frequency line L. An output signal at the oscillation frequency $f_r$ can be picked off at any point of the oscillator circuit. The temperature stability and the phase noise are critically determined by the quality Q of the feedback loop, that is to say the dielectric resonator DR. The dielectric resonator DR acts as a reflection filter in a reflection-type DRO.

Figure 2:
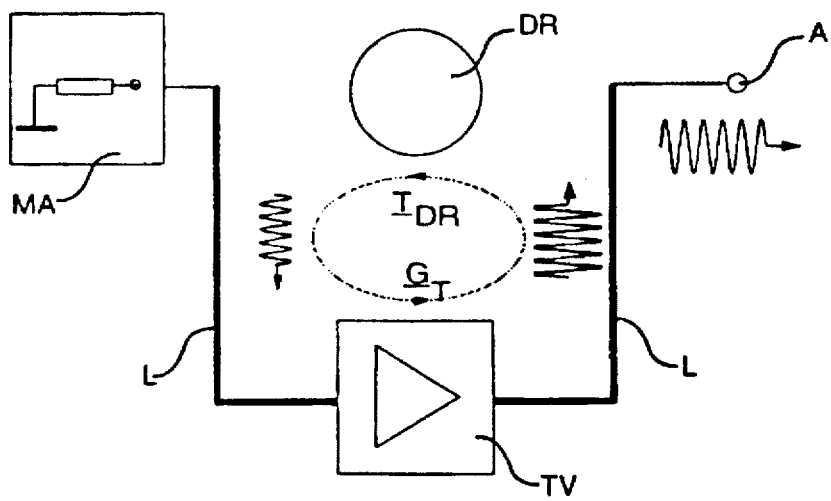
FIG. 2 shows the principle of a transmission-type DRO.

In the transmission-type DRO illustrated in FIG. 2, the transmission amplifier TV has a complex transmission gain $V_T$ where $|V_T|>1$. Mode jumping, as in the case of the oscillator illustrated in FIG. 1, cannot occur here because the parallel feedback is effective only at the resonant frequency. In this case the oscillation condition reads $V_T \cdot T_{DR} = 1$. $T_{DR}$ is the complex transmission factor of the dielectric resonator DR. The dielectric resonator DR acts as a transmission filter.

In conventional DROs, the point of resonance of the dielectric resonator DR1, which is mounted lying on its end face SF (to the left in FIG. 3), at the lowest frequency, which is called the fundamental mode or $TE_{01\delta}$ mode, is used. In this case, the dielectric resonator DR is a disk, a cylindrical body, made of dielectric low-loss ceramic material having a relative permittivity $\epsilon_R$ of between 20 and 90. Coupling to the RF line L takes place via the coupling of the magnetic leakage fields $H_{DR}$ and $H_{MS}$ of the dielectric resonator DR and of the RF line L. $H_{DR}$ is the magnetic leakage field of the dielectric resonator DR and $H_{MS}$ is the magnetic leakage field of the RF line L.

Figure 3:
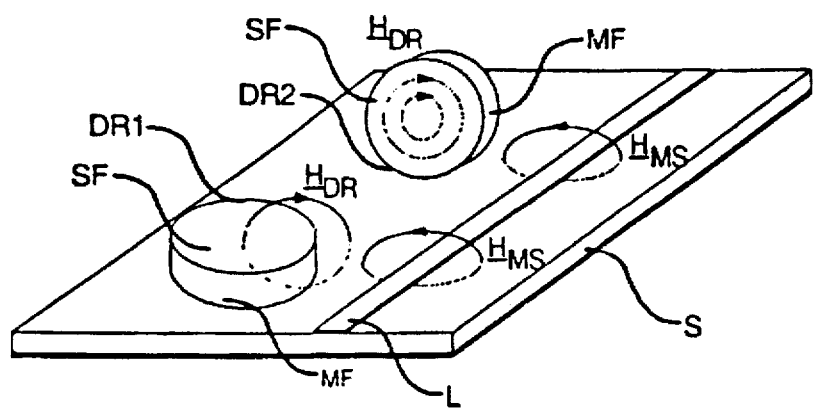
FIG. 3 shows conventional coupling in which the dielectric resonator lies with its end face on the substrate, and the new coupling in which the dielectric resonator is standing on its curved surface.

In contrast to this, in the invention the dielectric resonator is coupled to the RF line in an upright position, that is to say it stands on its curved surface MF (to the right in FIG. 3). The resonator DR2 is in this case operated in a higher mode than the fundamental mode. Here, too, the fields $H_{DR}$ and $H_{MS}$ of the dielectric resonator DR and RF line L are coupled, but distinctly higher qualities Q can be achieved in this arrangement according to the invention.

FIG. 3 shows a planar radio-frequency line L arranged on a substrate S. The dielectric resonator DR1 lying on its end face SF in a conventional manner couples to the line L in its fundamental mode ($TE_{01\delta}$ mode). The fundamental mode is the lowest resonant frequency of the dielectric resonator DR. In contrast to this, in the invention the dielectric resonator DR2 is placed on its curved surface MF and coupled to the RF line L at a higher mode ($TM_{xxx}$ mode). The field lines $H_{DR}$ of the dielectric resonator and $H_{MS}$ of the RF line are illustrated diagrammatically for both resonators DR1 and DR2.

Figure 4:
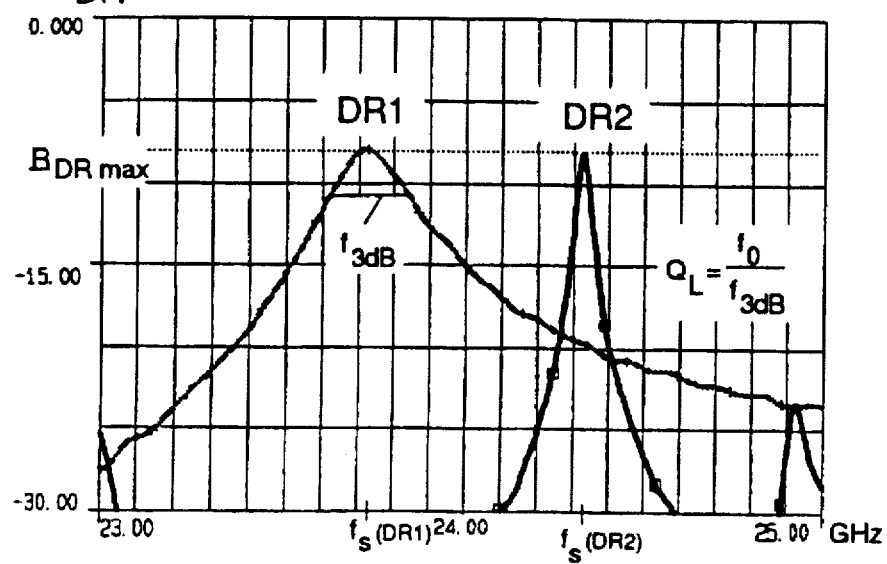
FIG. 4 shows a comparison of the bandwidths (and of the qualities Q) for a reflection filter in the case of conventional coupling and the new coupling.

FIG. 4 specifies the measured values of the associated filter curves (reflection factor $|R_{DR}|$), in an arrangement according to FIG. 3 the measurement having been effected at one connection of the RF line L and the other connection being terminated by a microwave absorber MA. Only one dielectric resonator DR is arranged on the substrate S for the purpose of measurement. The comparison of the resonance curves of the two differently arranged dielectric resonators DR1 and DR2 shows a distinct improvement in the filter quality Q when the dielectric resonator DR is coupled standing on its curved surface MF. The technical data of the two resonators DR1 and DR2 used for this comparison are specified in the following table:

| Mode DR used | D [mm] | h [mm] | $\epsilon_r$ | $Q_0 \cdot f$ [GHz] | Material |
| --- | --- | --- | --- | --- | --- |
| DR1 $TE_{01\delta}$ | 2.7 | 1.1 | 29 | $100 \cdot 10^3$ | Ba(Zr, Zn, Ta)O$_3$ |
| DR2 $TM_{021+\delta}$ | 4.9 | 2.0 | 38 | $50 \cdot 10^3$ | (Zr, Sn)TiO$_4$ |

D = diameter of the dielectric resonator DR
h = thickness of the dielectric resonator DR
$Q_0 \cdot f$ = no-load quality/frequency product of the dielectric resonator DR
$\epsilon_R$ = relative permittivity The addition $+\delta$ indicates that part of the field lies outside the dielectric resonator DR.

In comparison with the conventional $TE_{01\delta}$ mode, the solution according to the invention achieves a quality Q which is about ten times higher with the same maximum amplitude in the resonance case. This can be inferred from the width of the resonance curves shown in FIG. 4.

Figure 5:
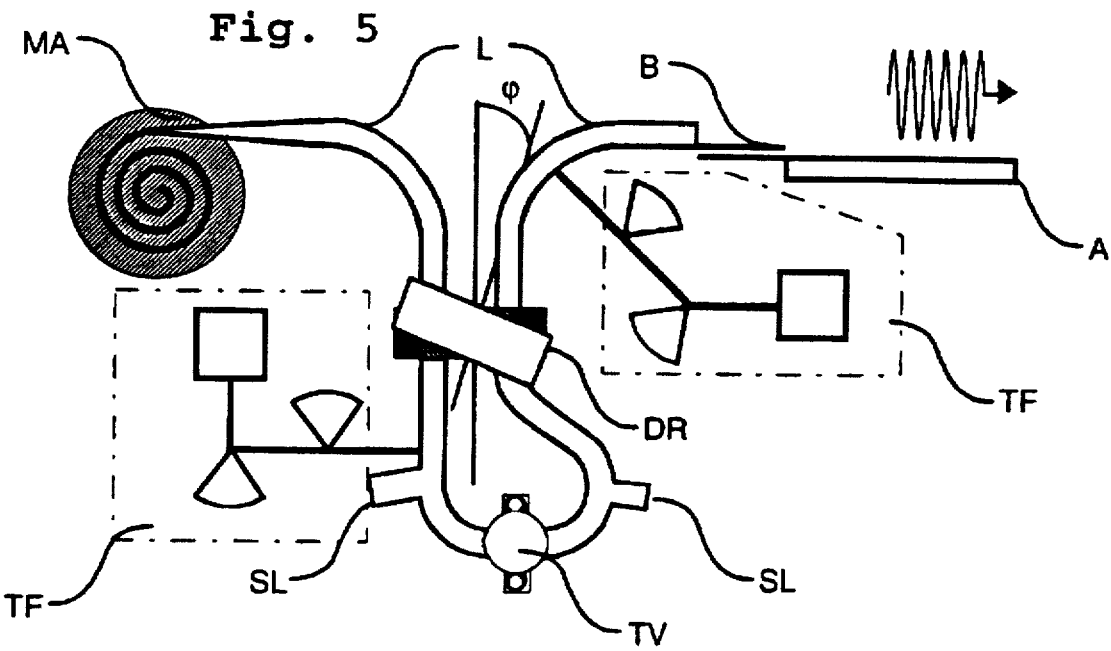
FIG. 5 shows by way of example the structure of an improved RF oscillator with novel coupling of the dielectric resonator with a high quality Q (transmission type DRO).

In the event of simultaneous coupling to two microstrip lines, the dielectric resonator DR acts as a transmission filter. One line acts as input and the second line acts as output, compare FIG. 5 in this respect. FIG. 5 shows an exemplary embodiment of a transmission-type DRO. The dielectric resonator DR is coupled to the planar lines L standing on its curved surface. A terminating resistor in the form of a microwave absorber MA is situated at one end of the planar line. The oscillator circuit is realized as a microstrip line circuit, and the layout is indicated in FIG. 5. The black regions represent metallization, that is to say a radio-frequency line. A transmission amplifier TV in the form, for example, of a microwave transistor is looped into a microstrip line L. At a suitable distance from the amplifier, the input line and output line of the amplifier run towards one another in such a way that it is possible to produce narrow-band overcoupling via their magnetic leakage field with a dielectric resonator DR, which stands on its curved surface MF. The distance is to be regarded as suitable whenever the following two conditions are met: 1. The phase of the loop comprising dielectric resonator DR, RF line L and amplifier must result in n•360° (oscillator phase condition). 2. The coupling between the dielectric resonator DR and the RF line L must be sufficiently strong (oscillator condition, $T_{DR} < V_T$).

If the dielectric resonator DR is not placed at right angles to the RF lines L, but rather is placed obliquely at an angle $\psi = 0°$ to 45°, an improvement in the electric coupling can be achieved.

The gain of the transistor must be greater than the complex transmission factor $T_{DR}$ of the dielectric resonator DR and, in addition, the entire phase cycle must be n•360°, and then the circuit starts to oscillate (oscillator oscillation condition: $T_{DR} \cdot V_T = 1$).

The DC voltage decoupling filter B in FIG. 5 is used for the DC voltage disconnection of the oscillator circuit and RF output A. The supply voltage is fed via a low-pass filter TF, comprising thin lines (inductances) in combination with circle sectors (capacitances). The gain of the transistor is optimized by means of spur lines SL for impedance matching. The circuitry of the two amplifier lines with microwave absorber or load resistor may vary depending on the application.

As a result of the high quality Q of the feedback used (dielectric resonator DR standing on the curved surface), the phase noise of the oscillator is decisively reduced and the temperature stability of the oscillation frequency $f_s$ is increased.

Figure 6:
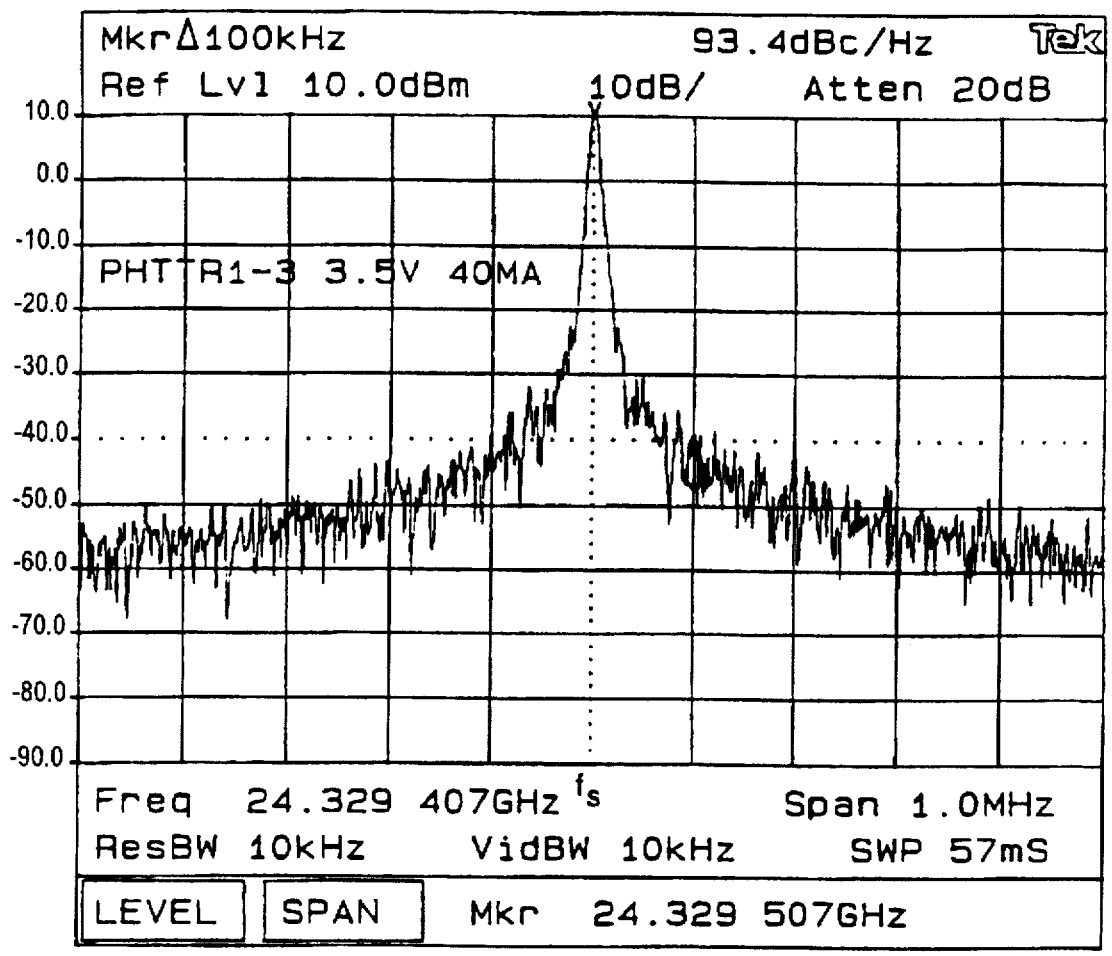
FIG. 6 shows the frequency spectrum of the improved RF oscillator from FIG. 5 for 24 GHz.

The output signal of the oscillator circuit described in FIG. 5 is shown in FIG. 6. This shows the output spectrum, which has been recorded using a spectrum analyzer. The phase noise is approximately −95 dBc/Hz with a carrier offset of 100 kHz. With the oscillator under investigation, the oscillation frequency $f_s$ is 24.329407 GHz at room temperature and varies by approximately 9 ppm/° C. when using a dielectric resonator DR having a temperature coefficient $T_c = 8$ ppm.

Figure 7:
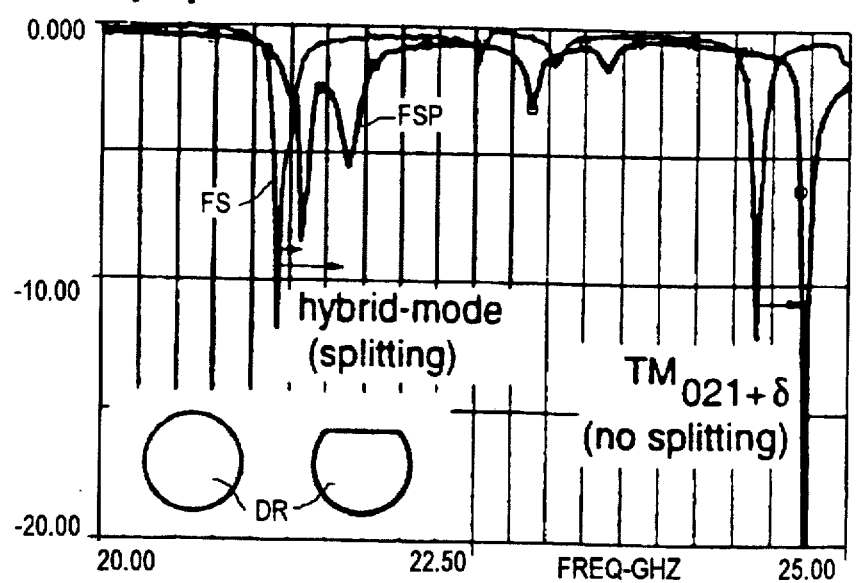
FIG. 7 shows typical filter curves of a reflection filter having a circular and a flattened dielectric resonator.

It is possible, for example for the purpose of simpler assembly, to flatten the circular cylindrical dielectric resonator DR on its curved surface, as is shown in FIG. 7. The effect of this is that the resonant frequencies are shifted towards higher frequencies. In FIG. 7, the first resonance curve FS illustrated by dashed lines corresponds to the circular cylindrical dielectric resonator DR. The second resonance curve FSP illustrated by a solid line belongs to the dielectric resonator DR which is flattened on its curved surface MF. Flattening the curved surface MF also has the effect, as is evident from FIG. 7, that the resonant frequency is split into two frequencies in the case of modes which are not rotationally symmetrical. In the case of the $TM_{021+\delta}$ mode, however, this effect does not occur, because it has a rotationally symmetrical field pattern. This has the advantage that a DRO which is operated with a dielectric resonator DR is insensitive to disturbances in the geometrical symmetry of the dielectric resonator DR and retains very good properties (high quality Q). The transmission factor T of the arrangement according to FIG. 3, but with only one dielectric resonator DR, is plotted on the y-axis.

In the case of rotationally symmetrical modes, there is, furthermore, the advantage that fine tuning of the resonant frequency is possible with no appreciable loss in quality by introducing a ceramic or metallic pin into a hole situated in the center of the dielectric resonator DR.

With a hole present in the center of the dielectric resonator DR, and if necessary a wire introduced in said hole, the resonant frequency is not split in the $TM_{021+\delta}$ mode.

Figure 8:
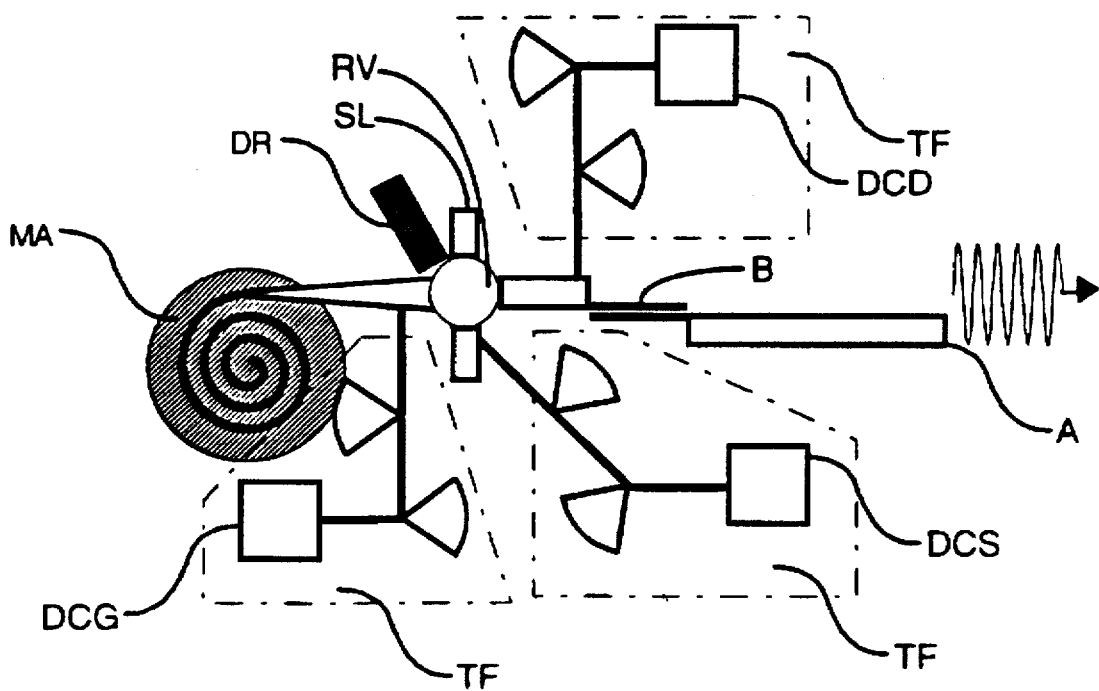
FIG. 8 shows by way of example the structure of an improved RF oscillator with novel coupling of the dielectric resonator with a high quality Q, the coupling primarily taking place with the amplifier (reflection type DR0).

FIG. 8 illustrates the example of a reflection-type DRO. The unloaded spur lines SL at the source connections of the transistor which is used and forms the reflection amplifier RV render the circuit capable of oscillation, that is to say reflection amplification is produced. Depending on the design of the circuit, the latter oscillates when the dielectric resonator DR, standing on its curved surface MF, is brought into the vicinity of the lines L or else only into the vicinity of the transistor housing. The operating voltage(s) is(are) fed via a low-pass filter TF, the finger structure—the DC voltage filter B—at the output A is used for DC voltage (DC) decoupling and the microwave absorber MA prevents reflections at the gate connection DCG of the transistor, also compare in this respect FIG. 5 of the transmission-type DRO. The drain connection is designated by DCD, the source connection by DCS and the gate connection by DCG.

In principle, many different configurations of reflection-type DROs are conceivable, see Bahl, Bhartia: "Microwave Solid State Circuit Design", John Wiley & Sons, 1988. The oscillator loop is formed either by the reflection amplifier RF, the dielectric resonator DR and the lines L or only by the reflection amplifier RV and the dielectric resonator DR. In FIG. 8, the output signal can be picked off at the output A of the oscillator circuit.

Apart from the application as feedback element in a radio-frequency oscillator, the dielectric resonator DR can also be used as RF filter component.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A radio-frequency oscillator of planar design, comprising:

an amplifier;

planar lines;

a substrate;

a dielectric resonator that is a frequency-determining element;

the amplifier connected to the dielectric resonator by at least one respective planar line of the planar lines arranged on the substrate;

the dielectric resonator having a cylindrical configuration; the dielectric resonator arranged standing on a curved surface thereof directly or indirectly on or in the substrate;

a normal vector of an end face of the dielectric resonator forming an angle in the range of 0° and 45° with the respective planar line; and the dielectric resonator operating in a higher mode than a fundamental mode thereof.

2. The oscillator as claimed in claim 1, wherein a cross-sectional shape of the cylindrical configuration of the dielectric resonator is circular.

3. The oscillator as claimed in claim 1, wherein a cross-sectional shape of the cylindrical configuration of the dielectric resonator is flattened.

4. The oscillator as claimed in claim 1, wherein the dielectric resonator is operated at modes at which a rotationally symmetrical field pattern prevails.

5. The oscillator as claimed in claim 1, wherein a relative dielectric constant of the dielectric resonator is in a range from 30 to 45.

6. The oscillator as claimed in claim 1, wherein the dielectric resonator has a hole in an end face thereof.

7. The oscillator as claimed in claim 1, wherein a diameter of the dielectric resonator is greater than a conductor track width of the respective planar lines.

8. The oscillator as claimed in claim 1, wherein the planar lines are coplanar.

9. The oscillator as claimed in claim 1, wherein the planar lines are microstrip lines.

10. The oscillator as claimed in claim 1, wherein the amplifier is a transistor.

11. The oscillator as claimed in claim 1, wherein the amplifier is one of an IMPATT diode or a Gunn element.

12. A radio-frequency oscillator of planar design, comprising:

an amplifier;

a substrate;

a dielectric resonator that is a frequency-determining element;

the amplifier connected to the dielectric resonator;

the dielectric resonator having a cylindrical configuration;

the dielectric resonator operating in a higher mode than the fundamental mode; and the dielectric resonator arranged standing on a curved surface thereof directly or indirectly on or in the substrate.

13. The oscillator as claimed in claim 12, wherein a cross-sectional shape of the cylindrical configuration of the dielectric resonator is circular.

14. The oscillator as claimed in claim 12, wherein a cross-sectional shape of the cylindrical configuration of the dielectric resonator is flattened.

15. The oscillator as claimed in claim 12, wherein the dielectric resonator is operated at modes at which a rotationally symmetrical field pattern prevails.

16. The oscillator as claimed in claim 12, wherein a relative dielectric constant of the dielectric resonator is in a range from 30 to 45.

17. The oscillator as claimed in claim 12, wherein the dielectric resonator has a hole in an end face thereof.

18. The oscillator as claimed in claim 12, wherein a diameter of the dielectric resonator is greater than a conductor track width of the respective planar lines.

19. The oscillator as claimed in claim 12, wherein the planar lines are coplanar.

20. The oscillator as claimed in claim 12, wherein the planar lines are microstrip lines.

21. The oscillator as claimed in claim 12, wherein the amplifier is a transistor.

22. The oscillator as claimed in claim 12, wherein the amplifier is one of an IMPATT diode or a Gunn element.

* * * * *